(12) United States Patent
Xu

(10) Patent No.: US 10,263,020 B2
(45) Date of Patent: Apr. 16, 2019

(54) PLANAR NANO-OSCILLATOR ARRAY HAVING PHASE LOCKING FUNCTION

(71) Applicant: SOUTH CHINA NORMAL UNIVERSITY, Guangzhou (CN)

(72) Inventor: Kunyuan Xu, Guangzhou (CN)

(73) Assignee: SOUTH CHINA NORMAL UNIVERSITY (CN)

( * ) Notice: Subject to any disclaimer, the term of this patent is extended or adjusted under 35 U.S.C. 154(b) by 96 days.

(21) Appl. No.: 15/311,221

(22) PCT Filed: Dec. 23, 2014

(86) PCT No.: PCT/CN2014/094584
§ 371 (c)(1),
(2) Date: Nov. 15, 2016

(87) PCT Pub. No.: WO2015/172561
PCT Pub. Date: Nov. 19, 2015

(65) Prior Publication Data
US 2017/0098670 A1    Apr. 6, 2017

(30) Foreign Application Priority Data
May 16, 2014  (CN) .......................... 2014 1 0210116

(51) Int. Cl.
*H01L 27/13*    (2006.01)
*H01Q 21/06*    (2006.01)
(Continued)

(52) U.S. Cl.
CPC .......... *H01L 27/13* (2013.01); *H01L 23/3171* (2013.01); *H01L 29/2003* (2013.01);
(Continued)

(58) Field of Classification Search
CPC . H03H 11/52; H03B 9/12; H03B 7/08; H01L 29/2003; H01L 29/205; H01L 28/20; H04B 3/06; H01Q 21/064; H01Q 21/06
(Continued)

(56) References Cited

U.S. PATENT DOCUMENTS

2008/0130356 A1    6/2008  Song
2013/0328635 A1*  12/2013  Sekiguchi ................ H03B 5/30
                                                                   331/105

FOREIGN PATENT DOCUMENTS

CN          1669144 A      9/2005
CN       100377354 C       3/2008
(Continued)

OTHER PUBLICATIONS

International Search Report PCT/CN2014/094584; International Filing Date: Dec. 23, 2014; 3 Pgs.
(Continued)

*Primary Examiner* — Arnold Kinkead
(74) *Attorney, Agent, or Firm* — Schmeiser, Olsen & Watts, LLP

(57) ABSTRACT

Provided is a planar nano-oscillator array having phase locking function, including two or more planar nano-oscillators which are arranged in parallel. The two oscillators are connected by planar resistors and capacitors, and a structure thereof includes: electrodes; respectively introducing two pairs of laterally arranged parallel insulation notch grooves into two-dimensional electron gas layers, so as to form oscillation channels; vertically disposing separating insulation notch grooves, so that a planar resistor A with low resistance which is connected to the electrode is formed on the left side, and a planar resistor B with low resistance which is connected to the electrode is formed on the right side; and arranging, between the two oscillators, an insulation capacitor notch groove which is parallel to the oscilla-
(Continued)

tion channels, insulating materials having a high dielectric constant being filled therein.

11 Claims, 4 Drawing Sheets

(51) Int. Cl.

| | |
|---|---|
| *H01L 29/772* | (2006.01) |
| *H01L 29/861* | (2006.01) |
| *H01L 23/31* | (2006.01) |
| *H01L 29/20* | (2006.01) |
| *H01L 29/205* | (2006.01) |
| *H03L 7/26* | (2006.01) |
| *H01L 49/02* | (2006.01) |
| *B82Y 20/00* | (2011.01) |

(52) U.S. Cl.
CPC .......... *H01L 29/205* (2013.01); *H01L 29/772* (2013.01); *H01L 29/861* (2013.01); *H01Q 21/06* (2013.01); *H01Q 21/064* (2013.01); *H03L 7/26* (2013.01); *B82Y 20/00* (2013.01); *H01L 28/20* (2013.01); *H01L 28/40* (2013.01)

(58) Field of Classification Search
USPC .......... 331/107 T, 107 G, 2, 107 DP, 46, 56; 343/700 MS
See application file for complete search history.

(56) References Cited

FOREIGN PATENT DOCUMENTS

| | | |
|---|---|---|
| CN | 101283461 A | 10/2008 |
| CN | 101431106 A | 5/2009 |
| EP | 0561580 B1 | 8/2001 |
| WO | WO2011027159 A1 | 3/2011 |

OTHER PUBLICATIONS

A. Íñiguez-de-la-Torre, I. Íñiguez-de-la-Torre, J. Mateos, T. González, P. Sangaré, M. Faucher, B. Grimbert, V. Brandli, G. Ducournau and C. Gaquière, "Searching for THz Gunn oscillations in GaN planar nanodiodes", J. Appl. Phys. 111, 113705 (2012).

J.-F. Millithaler, I. Iñiguez-de-la-Torre, A. Iñiguez-de-la-Torre, T. González, P. Sangaré, G. Ducournau, C. Gaquière, and J. Mateos, "Optimized V-shape design of GaN nanodiodes for the generation of Gunn oscillations", Appl. Phys. Left. 104, 073509 (2014)).

* cited by examiner

PLANAR NANO-OSCILLATOR ARRAY HAVING PHASE LOCKING FUNCTION

CROSS-REFERENCE TO RELATED APPLICATIONS

This application claims priority to PCT Application No. PCT/CN2014/094584, having a filing date of Dec. 23, 2014, based off of Chinese Application No. 201410210116.8 having a filing date of May 16, 2014, the entire contents of which are hereby incorporated by reference.

FIELD OF TECHNOLOGY

The following relates to a planar nano-oscillator array, in particular to a nano-oscillator array having phase locking function and capable of operating in the terahertz frequency band at room temperature.

BACKGROUND

The terahertz (THz) wave is an electromagnetic wave having a frequency range of approximately 0.1 to 10 THz (1 THz=$10^{12}$ Hz). It represents a special region in electromagnetic spectrum where it overlaps the millimeter wave in its long-wave direction and overlaps the infrared in its short-wave direction. However, due to technical limitations, the research into THz wave lag far behind those into the millimeter wave and infrared ray, which makes it the last frequency window to be fully explored in the electromagnetic spectrum. It is called the "THz gap". However, the THz wave has a series of unique properties, making it not only academically important in basic science, but also applicable in science and technology as well as in industry. The THz wave is in the transition zone from the macroscopic classical theory to the microscopic quantum theory, and is also in the transition zone from electronics to photonics, covering in frequency domain the rotation and oscillation frequency of a variety of macromolecules, including proteins. Also, it has a very low quantum energy which will not damage materials, and thus has a great advantage over X-ray and will become a very powerful tool in studying various substances, especially living substance. The wavelength of THz wave is over 1000 times shorter than that of microwave, which gives it such a high spatial resolution that it can be used in information science for high spatial and temporal resolution imaging, signal processing, large-capacity data transmission and broadband communication. In addition, the THz wave also has broad application prospects in materials evaluation, layered imaging, biological imaging, plasma fusion diagnosis, astronomy and environmental science, and even in drug testing, weapon search and military intelligence collection.

Both the detector and the radiation source of the THz wave play a foundational and key role in the THz technology, which have already become the domestic and foreign research hotspot. The device based on planar nanostructures has attracted more and more attention with its simple manufacturing, easy integrating and low parasitic capacitance. In March 2008, CN02808508.6 (Publication No. CN100377354C) disclosed a planar diode device of nanometric dimensions. The device is obtained by etching insulated lines in a conductive substrate to define charge carrier flow paths by using nano-etching technique. The device can be used to construct a full family of logic gates, such as OR, AND and NOT, and construct a rectifier for detecting electromagnetic waves. Recent experiments show that such devices can detect electromagnetic waves with a frequency up to 1.5 THz at room temperature, and that the detection frequency can be increased to 2.5 THz if the operating temperature is lowered to 150K. Since such a device has a negative differential resistance under reverse bias voltage, it can be used as a key component of an oscillation circuit. Then, CN200810219701.9 (Publication No. CN101431106A) disclosed a spontaneously-oscillating planar nano-electromagnetic radiation device, and the key method for manufacturing the same.

As oscillators with nonlinear periodic systems get close to one another, their oscillating phases will change due to the coupling effect and further abundant phenomena such as in-phase (synchronous) oscillation, phase-locked oscillation and inverse oscillation will occur. Related research in the field of science and technology has always been attached great importance. The earliest research can be traced back to February 1665 when the famous physicist Huygens made an observation of two pendulums. Later it was found that the phase-locked phenomena abound in nature and daily life, as illustrated by the fact that the congregated fireflies will spark simultaneously, that cardiac pacing cells beat consistently, and that mother and baby have the same heart rate. The Adler equation is the milestone in the field of electronics. It tells people how weak coupling LC oscillators will work when they are arranged in arrays. For the nano-oscillator, using phase-locked technology to produce phased array can not only improve the output power of the device, but also develop a directional radiation source for wireless communication.

Although phase issues are critical to an oscillator array, CN200810219701.9 (Publication No. CN101431106A) does not disclose key techniques related to phase locking, nor does it disclose an oscillator array having phase locking function. Moreover, the follow-up studies have been devoted to studying how to improve the performance of a single planar nano-oscillator (A. Íñiguez-de-la-Torre, I. Íñiguez-de-la-Torre, J. Mateos, T. González, P. Sangaré, M. Faucher, B. Grimbert, V. Brandli, G. Ducournau and C. Gaquière, "Searching for THz Gunn oscillations in GaN planar nanodiodes", J. Appl. Phys. 111, 113705 (2012); J.-F. Millithaler, I. Íñiguez-de-la-Torre, A. Íñiguez-de-la-Torre, T. González, P. Sangaré, G. Ducournau, C. Gaquière, and J. Mateos, "Optimized V-shape design of GaN nanodiodes for the generation of Gunn oscillations", Appl. Phys. Lett. 104, 073509 (2014)).

SUMMARY

An aspect relates to providing a planar nano-oscillator array having phase locking function, which can be easily manufactured and integrated on a single chip, and can operate in the terahertz frequency band at room temperature.

To achieve the above aspect, the following technical solution is employed: a planar nano-oscillator array having phase locking function, comprising two or more planar oscillators arranged in parallel; the oscillators are connected by planar resistors and a capacitor functioning as the coupling effect to form a multi-path planar coupling.

The width of the oscillation channel of each oscillator is less than 1 micron, and the distance between two adjacent oscillation channels is less than 1 micron.

The nano-oscillators and the planar coupling resistors and capacitor that connect the nano-oscillators are obtained by introducing nanometer insulation notch grooves into a same two-dimensional conductive material having negative differential mobility.

The input end of each oscillator is connected with the electrode through a planar resistor A with low resistance to form an input end of the array; the two lateral sides and the output end of each oscillator are connected with the electrode through a planar resistor B with low resistance to form an output end of the array; the coupling capacitor between the oscillators is connected with the planar resistor B; the planar resistors A and B are insulated from each other.

The cross-sectional structure of the array device comprises an insulating substrate layer, a two-dimensional semiconductor conductive layer having negative differential mobility, and an insulating protective layer in a bottom-to-top order.

Further, the device is fabricated on an AlGaN/GaN heterojunction-structural plane; the cross-sectional structure of the AlGaN/GaN heterojunction-structure comprises an insulating substrate, a GaN layer, a two-dimensional electron gas layer on the AlGaN/GaN heterogenous interface, and an AlGaN layer in a bottom-to-top order.

According to one embodiment of the present invention, the oscillator comprises two electrodes, an oscillation channel and a capacitor notch groove; the oscillation channel is formed by introducing two lateral insulation notch grooves into the two-dimensional electron gas layer; vertically disposed separating insulation notch grooves divide the region of the device plane except for the oscillation channel into a left side region and a right side region which are insulated from each other, thereby forming on the left side a planar resistor A with low resistance connected to an left-side electrode and on the right side a planar resistor B with low resistance connected to an right-side electrode so that carriers between the two planar resistors can only transport through the oscillation channel in the nano-oscillators; all the notch grooves mentioned above shall penetrate at least the two-dimensional electron gas layer.

Preferably, the vertical separating insulation notch grooves are disposed near the input end of the oscillator.

According to one preferred embodiment of the present invention, the array consists of oscillators with the same structure; the capacitor notch groove is located between two adjacent oscillation channels and has a width that is less than the distance between the oscillators and a length that is less than that of the oscillation channels; the dielectric constant of the capacitor notch groove is greater than or equal to that of the two-dimensional conductive material.

According to one preferred embodiment of the present invention, the array consists of oscillators with the same structure; the capacitor notch groove is located between the output ends of the oscillators and has a width that is less than the distance between the nano-oscillators; the dielectric constant of the capacitor notch groove is greater than or equal to that of the two-dimensional conductive material.

The device of embodiments of the present invention has the following beneficial effects. It can work at room temperature, operate in a high frequency band (the terahertz band), be easily manufactured as manufacturing a single chip, and be seamlessly connected with monolithic microwave integrated circuits (MMICs), with its designable operating performance. When the oscillators work in phase, the synthesis of the output signal will achieve the best coherent enhancement; when the adjacent oscillators work in reverse phase, the fundamental frequency components of the output signal cancel each other out, generating the signal and achieving higher harmonic extraction, without the need of adding a filtering device.

BRIEF DESCRIPTION

Some of the embodiments will be described in detail, with reference to the following figures, wherein like designations denote like members, wherein.

Figure 3:
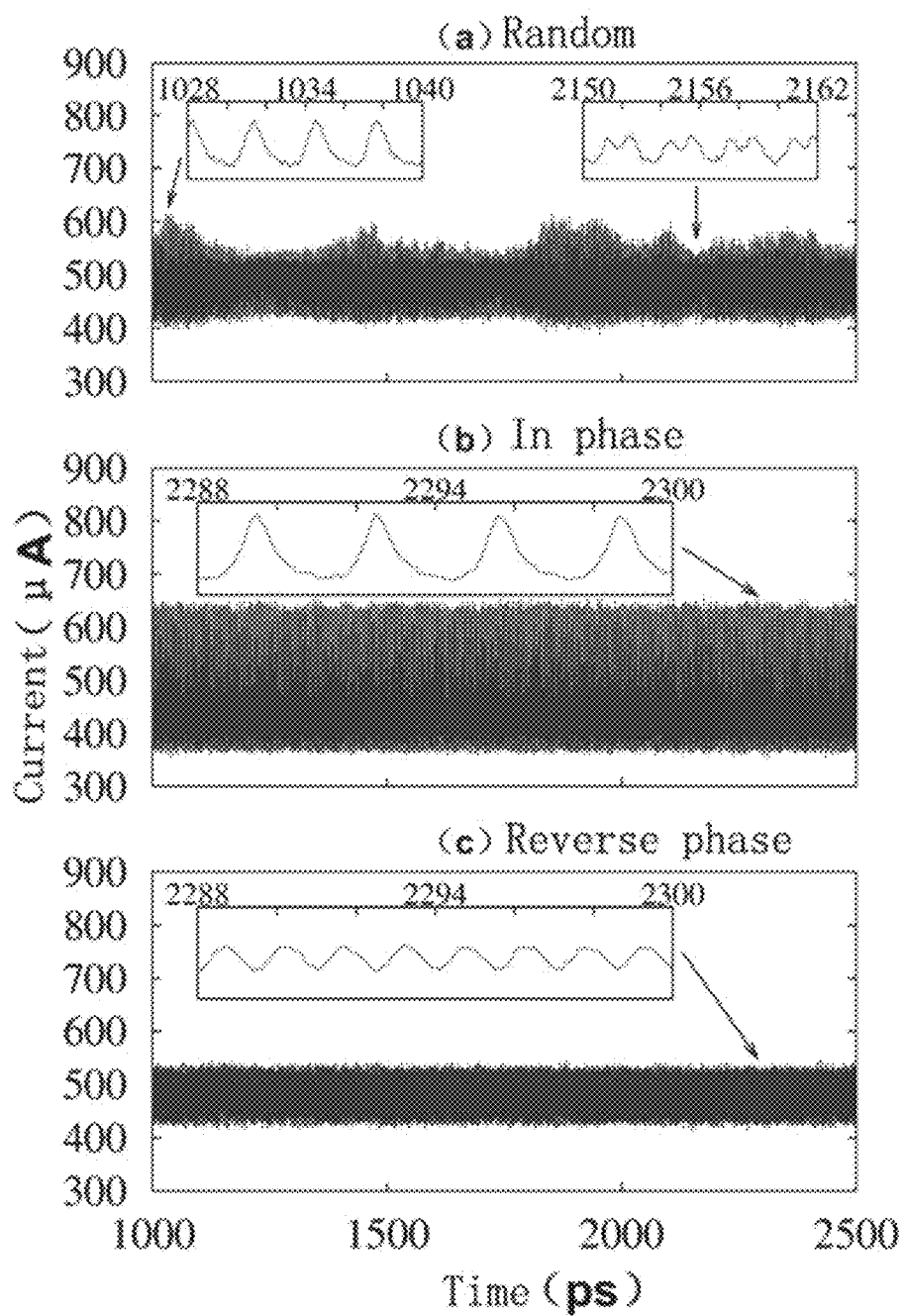
Figure 4:
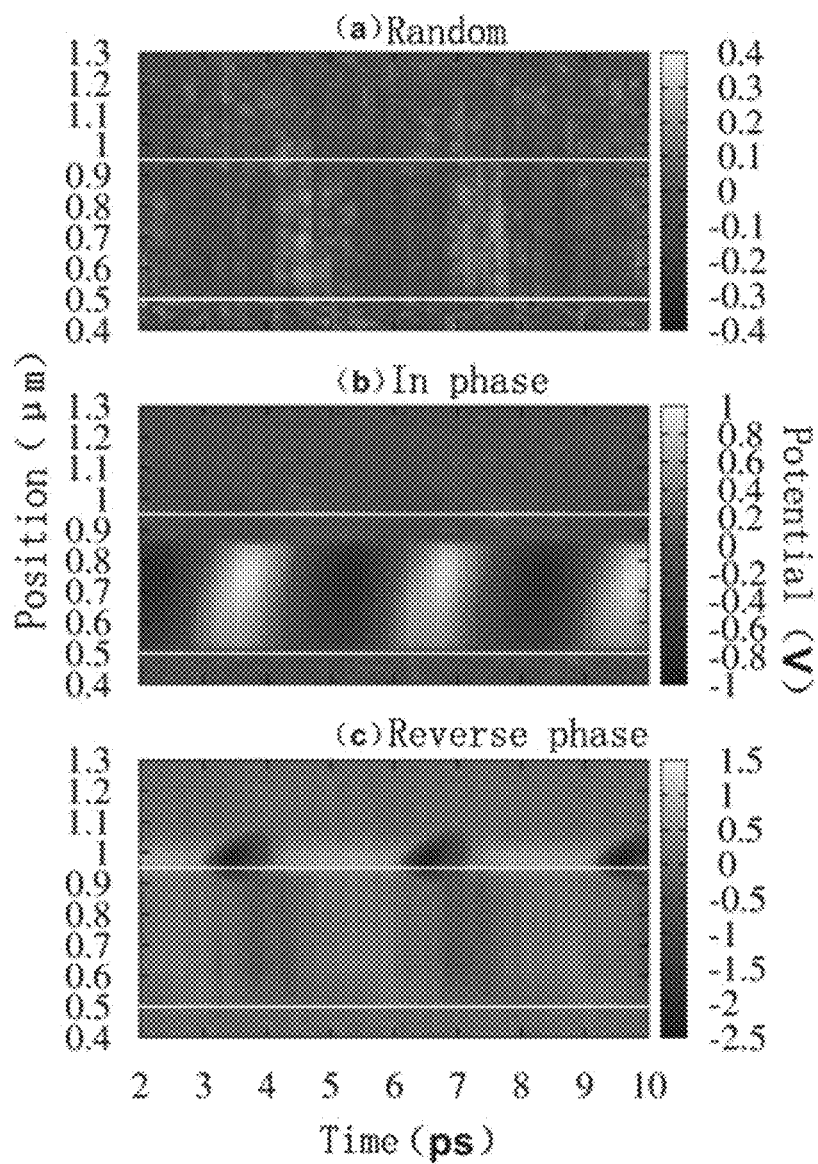

FIG. 3 shows the output characteristics of the preferred embodiment obtained from Monte Carlo's simulation, and the output characteristics of the non-preferred embodiment of the known art for comparison. (a) corresponds to the non-preferred embodiment, (b) corresponds to the preferred embodiment 1, and (c) corresponds to the preferred embodiment 2; and FIG. 4 shows the space-time coupling characteristics of the various embodiments obtained from Monte Carlo's simulation for illustrating the working mechanism. (a) corresponds to the non-preferred embodiment, (b) corresponds to the preferred embodiment 1, and (c) corresponds to the preferred embodiment 2.

DETAILED DESCRIPTION

Embodiments of the present invention are described in detail below with reference to the attached drawings and embodiments, and to the operating characteristics of the device obtained by numerical simulation. Further, it should be noted that embodiments of the present invention are not limited to the embodiments which will be described herein below.

A planar nano-oscillator array having a phase locking function: comprising two or more planar nano-oscillators arranged in parallel, which are connected by a pre-designed planar resistor and capacitor. The above mentioned resistor and capacitor has the following two functions: to adjust the impedance between the oscillators to improve the coupling efficiency and to provide a specific impedance matching path so as to make the coupling between the oscillators occur along a specific path determined by impedance matching, such that the oscillator operates spontaneously in a pre-set phase relation.

The oscillators are arranged in an array in such a way that the input end is connected to the electrode through a planar resistor A with low resistance (compared to that of the oscillator) to form the input end of the array, and the two lateral sides and the output end of the oscillator are connected with the electrode through another planar resistor B with low resistance to form the output end of the array. The coupling capacitor is introduced between the oscillators and connected with the resistor B. The planar resistors A and B are insulated from each other.

The nano-oscillators and the planar coupling resistors and capacitor that connect the nano-oscillators can all be obtained by introducing nanometer insulation notch grooves into a two-dimensional conductive material having negative differential mobility.

The insulation notch grooves can be divided into three kinds according to their functions: the isolation notch groove, the oscillator notch groove and the capacitor notch groove. The oscillator notch groove is used to define the oscillation channel so as to construct the nano-oscillator. The isolation notch groove is used to isolate the two electrode regions so that the carriers between them can only be transmitted through the oscillation channel of the nano-oscillator. The capacitor notch groove is used to change the impedance characteristics between the nano-oscillators. The above insulation notch grooves must penetrate the two-dimensional conductive layer. In view of the insulation and isolation of the isolation notch groove, in order to minimize its effect on the characteristics of the oscillator, the width of the isolation notch groove should be minimized and it should be located far away from the signal output end of the nano-oscillator.

The interaction of the nano-oscillators depends on the planar resistors and the capacitor that are defined by the insulation notch grooves. The coupling resistance between the oscillators can be achieved by varying the distance between the oscillators. Changing the length, width, dielectric constant and position of the capacitor notch groove can achieve the adjustment of the coupling capacitor. In addition, the planar coupling capacitor can also be adjusted by adding an insulating dielectric material layer to the surface of the device. By designing suitable coupling capacitors and resistors, the phase difference between adjacent oscillators can be chosen from 0 to π.

Embodiments of the present invention adopts oscillators with the same structure to arrange in arrays with the following design: The capacitor notch groove is located between the nanoscale oscillation channels and has a width that is less than the distance between the oscillators and a length that is less than that of the oscillation channels. The capacitor notch groove is filled with an insulating material whose dielectric constant is greater than or equal to that of the two-dimensional conductive material. With this arrangement, the coupling path on the lateral side of the oscillator dominates, and oscillators will spontaneously oscillate in phase.

Embodiments of the present invention adopts oscillators with the same structure to arrange in arrays with the following design: The capacitor notch groove is located between the output ends of the oscillator, and its width is less than the distance between the nano-oscillators. The capacitor notch groove is filled with an insulating material whose dielectric constant is greater than or equal to that of the two-dimensional conductive material. With this arrangement, the coupling path between the output ends of the oscillator dominants, and adjacent oscillators will oscillate spontaneously in reverse phase. Therefore, the output of the array is higher harmonic (quadratic harmonic) with the fundamental frequency filtered out.

Preferably, the length and width of the oscillation channels of oscillators are less than 1 micron and the distance between the adjacent oscillation channels is less than 1 micron.

Embodiment 1

Figure 1A:
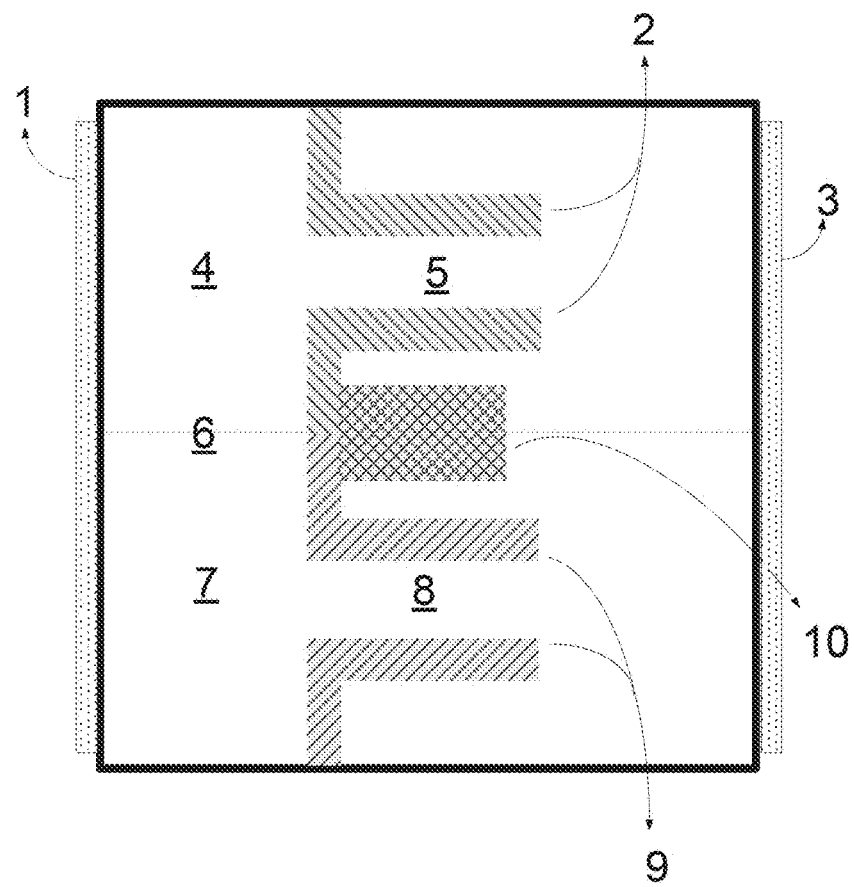
FIG. 1a is a schematic view of the preferred embodiment 1 of the present invention in which in-phase oscillation can be achieved.
Figure 1B:
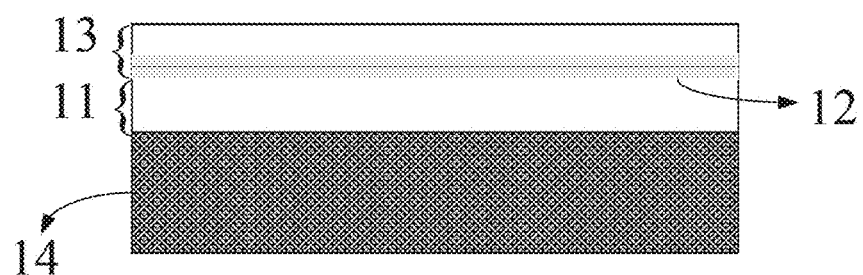
FIG. 1b is a cross-sectional view of the material system used to fabricate the device.

FIG. 1a is a schematic view of the preferred embodiment 1 of the present invention in which in-phase oscillations can be achieved. The device is fabricated on the AlGaN/GaN heterojunction structural plane as shown in FIG. 1b. The cross-sectional structure of the AlGaN/GaN heterojunction-structure consists of an insulating substrate 14, a GaN layer 11, a two-dimensional electron gas layer 12 on the AlGaN/GaN heterogenous interface and an AlGaN layer 13 in this bottom-to-top order.

The device contains two oscillators of the same size, as shown in FIG. 1a. 1 and 3 are electrodes. Dashed line 6 is the central axis of the device. Two oscillators above and below the central axis respectively are arranged in parallel. The oscillation channel 5 of the oscillator that is above the dashed line 6 is formed by introducing lateral insulation notch grooves 2 into the rectangular two-dimensional electron gas layer 4. The oscillating channel 8 of the oscillator that is below the dashed line 6 is formed by introducing two lateral insulation notch grooves 9 in parallel into the rectangular two-dimensional electron gas layer 7. Vertically disposed separating insulation notch grooves divide the region of the device plane except for the oscillation channels into a left side region and a right side region which are insulated from each other, thereby forming on the left side a planar resistor A with low resistance connected to the electrode 1 and on the right side a planar resistor B with low resistance connected to the electrode 3 so that carriers between the two planar resistors can only transmit through the oscillation channels in the nano-oscillators. The vertical separating insulation notch grooves are preferably disposed near the input end of the oscillator. In the present embodiment, three vertical separating insulation notch grooves are disposed on the entrance of the oscillation channels. The first separating insulation notch groove extends upwardly from the upper insulation notch groove of the insulation notch grooves 2 to the edge of the device; the second separating insulation notch groove extends downwardly from the lower insulation notch groove of the insulation notch grooves 2 to the upper insulation notch groove of the insulation notch grooves 9; and the third separating insulation notch groove extends downwardly from the lower insulation notch groove of the insulation notch grooves 9 to the lower edge of the device.

Between the two oscillators is disposed a rectangular insulation capacitor notch groove 10 for adjusting the coupling path and intensity, which is parallel to and disposed between the oscillation channels 5 and 8. The left side of the insulation capacitor notch groove is connected to the second separating insulation notch groove. The length of the insulation capacitor notch groove is slightly less than that of the oscillation channels. And the insulation capacitor notch groove is filled with an insulating material of high dielectric constant.

All the insulation notch grooves described above can be obtained by dry etching. They should be deep enough to penetrate the two-dimensional electron gas layer 12 to meet the shallowest depth requirement. In order to avoid the effects of depth fluctuation on device performance in manufacturing, the depth of the notch grooves must be greater than 300 nm.

Embodiment 2

Figure 2:
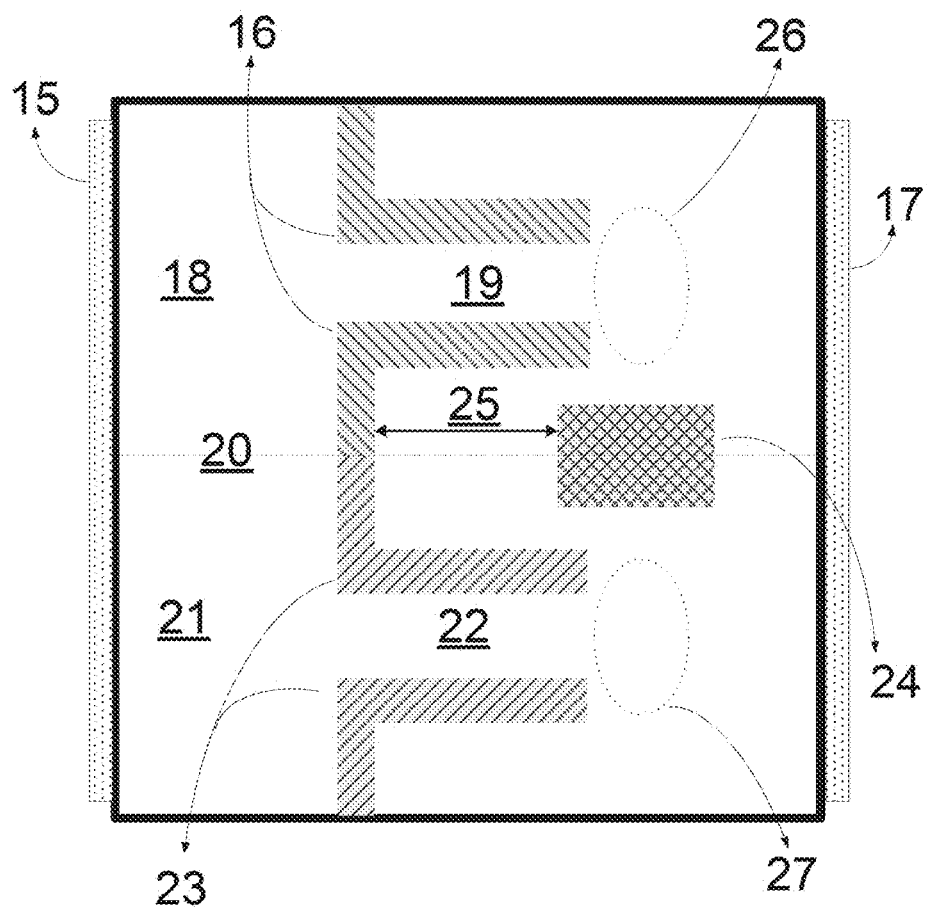
FIG. 2 is a schematic view of the preferred embodiment 2 of the present invention in which the reverse phase oscillation can be achieved.

FIG. 2 is a schematic view of the preferred embodiment 2 of the present invention in which reverse-phase oscillations can be achieved. The device is also fabricated on an AlGaN/GaN heterojunction structure as shown in FIG. 1(b). The structure of the device is the same as that of Embodiment 1, except that the coupling part is different, as shown in FIGS. 2. 15 and 17 are electrodes. Dashed line 20 is the central axis of the device. Two oscillators above and below the central axis are arranged respectively. The oscillation channel 19 of the oscillator that is above the dashed line 20 is formed by introducing the two lateral insulation notch grooves 16 into the rectangular two-dimensional electron gas layer 18. The oscillating channel 22 of the oscillator that is below the dashed line 20 is formed by introducing two insulation notch grooves 23 into the rectangular two-dimensional electron gas layer 21. And vertically disposed separating insulation notch grooves divides the region of the device plane except for the oscillation channels into a left side region and a right side region which are insulated from each other, thereby forming on the left side a planar resistor A with low resistance connected to the electrode 15 and on the right side a planar resistor B with low resistance connected to the electrode 17 so that carriers between the two planar resistors can only transmit through the oscillation channels in the nano-oscillators. The vertical separating insulation notch grooves are preferably disposed near the input end of the oscillator. In the present embodiment, three vertical separating insulation notch grooves are disposed on the entrance of the oscillation channels. The first separating insulation notch groove extends upwardly from the upper insulation notch groove of the insulation notch grooves 19 to the edge of the device; the second separating insulation notch groove extends downwardly from the lower insulation notch groove of the insulation notch grooves 19 to the upper insulation notch groove of the insulation notch grooves 22; and the third separating insulation notch groove extends downwardly from the lower insulation notch groove of the insulation notch grooves 23 to the lower edge of the device.

Between the two oscillators is disposed a rectangular insulation notch groove 24 for adjusting the coupling path and intensity, which is parallel to the oscillation channels. The distance 25 between the left side of the insulation notch groove 24 and the second separating insulation notch groove is slightly less than that of the oscillation channels, so that a small portion of the insulation notch groove 24 is disposed between the oscillation channels, but most of it is disposed between the output ends of the oscillator (regions 26 and 27 circled by dashed circles). And the insulation notch groove is filled with an insulating material of high dielectric constant. The insulation notch grooves described above can be obtained by dry etching. They should be deep enough to penetrate the two-dimensional electron gas layer 12 to meet the shallowest depth requirement. In order to avoid the effects of depth fluctuation on device performance in manufacturing, the depth of the notch grooves must be greater than 300 nm.

The operating characteristics of the structures of the above-described embodiments 1 and 2 at room temperature can be obtained by the ensemble Monte Carlo simulation (see FIGS. 3 and 4). The structure used in the simulation is characterized by the following characteristic parameters. The length of the oscillation channels is 450 nm and the width is 50 nm; the width of the lateral and vertical notch grooves is 30 nm and the depth is 500 nm, the dielectric constant being 1 (not filled with insulating material with high dielectric constant); the distance between the two oscillation channels is 200 nanometers; the insulation capacitor notch groove with the function of coupling also has a depth of 500 nanometers, and is filled with insulating material with a 8.9 dielectric constant. For comparison, FIG. 3(a) shows the output characteristics of the non-preferred structures (to arrange the oscillators disclosed in CN200810219701.9 in array) obtained by simulation. Obviously, the amplitude of the oscillating output current of the device changes irregularly over time. From FIG. 3(a), it is further found that not only the amplitude of the oscillating current changes but also the oscillating waveform changes significantly. FIG. 3(b) shows the output characteristics of the preferred embodiment 1. In the simulation, the length of the insulation capacitor notch groove 10 is set to be 320 nm and the width to be 130 nm. It can be seen from the simulation result that the oscillation of the output of the device does not change over time except for a little fluctuation. In FIG. 3(b), the oscillating fundamental frequency is about 0.3 terahertz, which is consistent with the fundamental frequency of the single device in the article. Therefore, it can be concluded that the oscillators in the device oscillate in phase. FIG. 3(c) shows the output characteristics of the preferred embodiment 2. In the simulation, the length of the insulation coupling groove 24 is set to be 350 nm, the width to be 130 nm, and the distance 25 between the insulation coupling groove 24 and the second separating insulation notch groove to be 320 nm. As can be seen from the simulation result, the oscillation of the output of the device does not vary over time except for a slight fluctuation, but its amplitude is only 40% of the amplitude of the output oscillation of the preferred embodiment 1. Furthermore, the oscillation frequency is about 0.6 terahertz, which is twice the frequency of the output fundamental frequency of the preferred embodiment 1, as can be seen from FIG. 3(c). Since the two oscillators in the device have the same structure, it can be concluded that the oscillators in the device are oscillating in reverse phase so that the fundamental frequency components cancel each other out and the output is mainly second harmonic.

In order to further reveal the working mechanism of the preferred embodiment, the coupling of the three embodiments above is further calculated. FIG. 4 shows the changes of the potential of the junction part of the oscillators over time and space. (a) corresponds to the non-preferred embodiment, (b) corresponds to the preferred embodiment 1, and (c) corresponds to the preferred embodiment 2. The two white horizontal lines give the starting and ending positions of the channel. It can be seen from FIG. 4(a) that the coupling between the oscillators in the non-preferred embodiment is weak and random in spatial and temporal distribution, which leads to the randomness of the output oscillation of the device. It can be seen from FIG. 4(b) that in the preferred embodiment 1 the coupling between the oscillators occurs mainly along the path between the channels and has a distinct time period characteristic (whose frequency coincides with the fundamental frequency of the oscillating current). It can be seen from FIG. 4(c) that in the preferred embodiment 2, the coupling between the oscillators occurs mainly along the path between the output ends of the oscillator and has a distinct time period characteristic (whose frequency also coincides with the fundamental frequency of the oscillating current). It can be seen from the above analysis that the introduction of the coupling structure has the following effects: to enhance the coupling strength between the oscillators and to make the coupling occur in a specific spatial location, so that the oscillator can oscillate in a specific phase relation.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

What is claimed is:

1. A planar nano-oscillator array having phase locking function, comprising two or more oscillators arranged in parallel, the oscillators being connected by planar coupling resistors and capacitors, functioning as a coupling effect to form a multi-path planar coupling; the oscillators and the planar coupling resistors and capacitors that connect the oscillators are obtained by introducing nanometer insulation notch grooves into a same two-dimensional conductive material having negative differential mobility.

2. The planar nano-oscillator array having phase locking function of claim 1, wherein a width of an oscillation channel of each oscillator is less than 1 micron, and a distance between two adjacent oscillation channels is less than 1 micron.

3. The planar nano-oscillator array having phase locking function of claim 1, wherein an input end of each oscillator is connected with an electrode through a planar resistor A with low resistance to form an input end of the array; two lateral sides and an output end of each oscillator are connected with an electrode through a planar resistor B with low resistance to form an output end of the array; the coupling capacitor between the oscillators is connected with the planar resistor B; the planar resistors A and B are insulated from each other.

4. The planar nano-oscillator array having a phase locking function according to claim 1, wherein a cross-sectional structure of the oscillators comprises an insulating substrate layer, a two-dimensional semiconductor conductive layer having negative differential mobility, and an insulating protective layer in a bottom-to-top order.

5. The planar nano-oscillator array having a phase locking function according to claim 2, wherein a cross-sectional structure of the oscillator comprises an insulating substrate layer, a two-dimensional semiconductor conductive layer having negative differential mobility, and an insulating protective layer in a bottom-to-top order.

6. The planar nano-oscillator array having phase locking function according to claim 3, wherein a cross-sectional structure of the oscillator comprises an insulating substrate layer, a two-dimensional semiconductor conductive layer having negative differential mobility, and an insulating protective layer in a bottom-to-top order.

7. The planar nano-oscillator array having phase locking function of claim 4, wherein the oscillator is fabricated on an AlGaN/GaN heterojunction-structural plane; a cross-sectional structure of the AlGaN/GaN heterojunction-structure comprises an insulating substrate, a GaN layer, a two-dimensional electron gas layer on the AlGaN/GaN heterogenous interface, and an AlGaN layer in a bottom-to-top order.

8. The planar nano-oscillator array having phase locking function of claim 7, wherein the oscillator comprises two electrodes, an oscillation channel and a capacitor notch groove; the oscillation channel is formed by introducing two lateral insulation notch grooves into the two-dimensional electron gas layer; vertically disposed separating insulation notch grooves divide a region of a plane of the oscillator except for the oscillation channel into a left side region and a right side region which are insulated from each other, thereby forming on the left side a planar resistor A with low resistance connected to an left-side electrode and on the right side a planar resistor B with low resistance connected to an right-side electrode so that carriers between the two planar resistors can only transmit through the oscillation channel in the nano-oscillators; all the notch grooves mentioned above penetrate at least the two-dimensional electron gas layer.

9. The planar nano-oscillator array having phase locking function of claim 8, wherein the vertical separating insulation notch grooves are disposed near an input end of each of the two or more oscillators.

10. The planar nano-oscillator array having a phase locking function of claim 9, wherein the array consists of two oscillators with the same structure; the capacitor notch groove is located between two adjacent oscillation channels and has a width that is less than a distance between the oscillators and a length that is less than a length of the oscillation channels; a dielectric constant of the capacitor notch groove is greater than or equal to that of the two-dimensional conductive material.

11. The planar nano-oscillator array having phase locking function of claim 9, wherein the array consists of two oscillators with the same structure; the capacitor notch groove is located between the output ends of the oscillators and has a width that is less than a distance between the oscillators and a length that is less than a length of the oscillation channels; a dielectric constant of the capacitor notch groove is greater than or equal to that of the two-dimensional conductive material.

\* \* \* \* \*